(12) United States Patent
Huang

(10) Patent No.: US 10,209,287 B2
(45) Date of Patent: Feb. 19, 2019

(54) QUICK-ACTION LEAKAGE DETECTION PROTECTION CIRCUIT HAVING REGULAR SELF-CHECKING FUNCTION

(71) Applicant: Wenzhou Van-sheen Electric Appliance Co.,Ltd, Yueqing, Zhejiang Prov. (CN)

(72) Inventor: Jinhe Huang, Yueqing (CN)

(73) Assignee: WENZHOU VAN-SHEEN ELECTRIC APPLIANCE CO., LTD, Yueqing (CN)

( * ) Notice: Subject to any disclaimer, the term of this patent is extended or adjusted under 35 U.S.C. 154(b) by 0 days.

(21) Appl. No.: 15/691,999

(22) Filed: Aug. 31, 2017

(65) Prior Publication Data

US 2018/0059163 A1  Mar. 1, 2018

(30) Foreign Application Priority Data

Aug. 31, 2016  (CN) .......................... 2016 1 0789501

(51) Int. Cl.
*G01R 31/02* (2006.01)
*G01R 15/18* (2006.01)
(Continued)

(52) U.S. Cl.
CPC ......... *G01R 31/025* (2013.01); *G01R 15/185* (2013.01); *G01R 31/44* (2013.01);
(Continued)

(58) Field of Classification Search
CPC .... G01R 31/025; G01R 15/185; G01R 31/44; H02H 3/16; H02H 3/162; H02H 3/32;
(Continued)

(56) References Cited

U.S. PATENT DOCUMENTS 7,883,346 B2  2/2011  Huang
7,887,346 B1  2/2011  Huang
(Continued)

FOREIGN PATENT DOCUMENTS

CN  103490377 A  1/2014
CN  103887764 A  6/2014
(Continued)

*Primary Examiner* — Mohamad Musleh
(74) *Attorney, Agent, or Firm* — Mei & Mark LLP

(57) ABSTRACT

A quick-action leakage detection protection circuit with a regular self-checking function is provided. The quick-action leakage detection protection circuit may include a power input end, a power load end, a power user end, twin induction coils for detecting leakage current and low resistance failure, a control chip, a trip coil in which an iron core is disposed, a reset button, a self-checking chip, and a self-checking silicon controlled rectifier. The reset button may be linked with a main circuit switch, an analog path switch, and a normally-open self-checking path switch. The main circuit switch may include a pair of dynamic contact levers extended from the power load end, a first pair of static contact ends extended from the power input end passing through the twin induction coils, and a second pair of static contact ends extended from the power user end. In some embodiments, a first end of the trip coil may be connected to a live line end of the power input end and to the live line of the power load end via the first normally-closed switch. And, a second end of the trip coil may be connected to a neutral line end of the power load end via a second normally-closed switch.

9 Claims, 4 Drawing Sheets

(51) Int. Cl.
*H02H 3/16* (2006.01)
*H02H 3/32* (2006.01)
*H02H 3/347* (2006.01)
*H02J 13/00* (2006.01)
*H05B 41/28* (2006.01)
*G01R 31/44* (2006.01)
*H02H 3/33* (2006.01)

(52) U.S. Cl.
CPC .............. *H02H 3/16* (2013.01); *H02H 3/162* (2013.01); *H02H 3/32* (2013.01); *H02H 3/33* (2013.01); *H02H 3/347* (2013.01); *H02J 13/00* (2013.01); *H05B 41/2813* (2013.01)

(58) Field of Classification Search
CPC ........... H02H 3/33; H02H 3/347; H02J 13/00; H05B 41/2813
See application file for complete search history.

(56) References Cited

U.S. PATENT DOCUMENTS

| | | | |
|---|---|---|---|
| 8,147,260 | B2 | 4/2012 | Huang |
| 8,154,832 | B2 | 4/2012 | Huang |
| 8,294,028 | B2 | 10/2012 | Huang |
| 8,297,990 | B2 | 10/2012 | Huang |
| 8,299,358 | B2 | 10/2012 | Huang |
| 8,300,368 | B2 | 10/2012 | Huang |
| 8,382,497 | B2 | 2/2013 | Huang |
| 8,462,471 | B2 | 6/2013 | Huang |
| 8,472,155 | B2 | 6/2013 | Huang |
| 8,525,372 | B2 | 9/2013 | Huang |
| 8,550,829 | B2 | 10/2013 | Huang |
| 8,736,279 | B2 | 5/2014 | Huang |
| 8,760,849 | B2 | 6/2014 | Huang |
| 8,858,245 | B2 | 10/2014 | Huang |
| 9,048,559 | B2 | 6/2015 | Huang |
| 9,088,152 | B2 | 7/2015 | Huang |
| 9,203,232 | B2 | 12/2015 | Huang |
| 9,728,951 | B2 | 8/2017 | Huang |
| 2015/0280430 | A1 | 10/2015 | Huang |

FOREIGN PATENT DOCUMENTS

| | | |
|---|---|---|
| CN | 104143812 A | 11/2014 |
| CN | 104393564 A | 11/2014 |

QUICK-ACTION LEAKAGE DETECTION PROTECTION CIRCUIT HAVING REGULAR SELF-CHECKING FUNCTION

CROSS-REFERENCE TO RELATED APPLICATION

This application claims priority to, and incorporates herein in its entirety, Chinese Patent Application No. 201610789501.1, filed Aug. 31, 2016.

TECHNICAL FIELD

The present disclosure relates to the field of leakage protection, and specifically to a quick-action leakage detection protection circuit with a regular self-checking function.

BACKGROUND

A leakage detection protection circuit disclosed by a Chinese Patent Application No. 201310452956.0 includes a power input end, a power user end, a power output end, a reset button, a main circuit switch linked with the reset button, twin induction coils for detecting leakage current and low resistance failure, a trip coil allowing the reset button to drive the main circuit switch to be closed or open/disconnected by driving a built-in iron core under the action of a magnetic field in collaboration with a mechanical structure, a silicon controlled rectifier for providing a path for analog leakage current, a control chip which may determine whether the silicon controlled rectifier is on or off according to a detection result of the twin induction coils, and a timed self-checking circuit. The leakage detection protection circuit is provided with a normally-open switch K1 linked with the reset button. The normally-open switch K1 is driven to be closed when the reset button is pressed down after the initial installation. The analog leakage circuit produces a current through resistor R7, leading to short circuiting the power input end. When the control chip detects the leakage current via the twin induction coils, the silicon controlled rectifier is driven to be turned on. After the trip coil is energized, the iron core moves and drives a latch in a leakage protection outlet to move. After being positioned by a locking piece lockhole hook, a guide pillar of the reset button rises to drive the main circuit switch to be closed. When the circuit is operating properly, in case of a reversed wire connection (e.g., wherein main power supply is mistakenly connected the power output end), a normally-closed switch connecting the power output end and the power user end is disconnected via a mechanism such as the control chip or the silicon controlled rectifier. Such reversed wire connection protection is unavailable when the mechanism such as the control chip or the silicon controlled rectifier is damaged.

Chinese Patent Application No. 201410112524.X discloses a leakage detection protection circuit having timed self-checking and reversed wire connection protection function. To implement the reversed wire connection protection and ensure that exactly two of the power input end, the power output end (e.g., load), and the power user end (e.g., electrical outlet) are electrically connected at any given time (e.g., there are always two groups of mutually isolated conductors), the circuit structure of the leakage detection protection circuit is further provided with normally-open switches (e.g., K3B-1 and KR3B-2) in addition to the main circuit switch. Therefore, such a leakage detection protection circuit is complex in structure, and is difficult, labor-intensive, and time-consuming to accurately assemble.

The disclosure of Chinese Patent Application No. 201410367800.7 offers some solutions to the above-described problems. However, some deficiencies still exist: For example, two trip coils are included, thus such solutions are relatively complex in structure and relatively inconvenient for processing and assembling.

The disclosure of Chinese Patent Application No. 201410667103.3 provides a solution for above technical problems. However, its solution may have several shortcomings: First, two ends of a dynamic contact lever of the main circuit switch have a dynamic contact point, and in the middle there is provided with a seesaw structure. Therefore, such configurations demand precision in processing, assembling, and action. An internal pressure test (continuously turned on/off for thousands of times) may cause poor contact among contact points, which could be a hidden danger. Second, beneath the seesaw dynamic contact lever, the seesaw dynamic contact lever is connected with a flexible lead. It is difficult to ensure reliable action of flexible lead and the precision of the seesaw dynamic contact lever. Third, a reversed wire connection circuit is not provided with a current-limiting circuit, and thus components (such as the trip coil) may likely be damaged due to temperature rise if the main circuit switch cannot timely trip during reversed wire connection. Fourth, after the reset button is pressed down, the dynamic contact lever of a normally-closed reversed wire connection path switch K5 is disconnected under pressure, and is closed after the pressed down is released. Thus, such a configuration demands precision in action, making it difficult to process and assemble.

SUMMARY

In the light of the above problems, the present disclosure provides a quick-action leakage detection protection circuit with a regular self-checking function.

An inventive objective of the present disclosure may be implemented by following solutions:

In one embodiment, a quick-action leakage detection protection circuit with a regular self-checking function is provided. The quick-action leakage detection protection circuit may include a power input end, a power load end, a power user end, twin induction coils for detecting leakage current and low resistance failure, a control chip, a trip coil in which an iron core is disposed, a reset button, a self-checking chip, and a self-checking silicon controlled rectifier.

The reset button may be linked with a main circuit switch, an analog path switch, and a normally-open self-checking path switch. The analog path switch may include a front-end normally-open switch and a rear-end normally-open switch. The front-end normally-open switch may be connected between a live line end of the power input end and a first end of the trip coil. The rear-end normally-open switch may be connected between a neutral line end of the power input end passing through the twin induction coils and a second end of the trip coil. The front-end normally-open switch and the rear-end normally-open switch may contact and close when the reset button is pressed down so that the trip coil may form a return circuit passing through the twin induction coils. A first end of the self-checking path switch may be connected to a live line end of the power input end. A second end of the self-checking path switch may be grounded through the self-checking silicon controlled rectifier. The self-checking path switch may be closed when the quick-action leakage detection protection circuit is in a working, reset state.

The main circuit switch may include a pair of dynamic contact levers extended from the power load end, a first pair of static contact ends extended from the power input end passing through the twin induction coils, and a second pair of static contact ends extended from the power user end. The pair of dynamic contact levers and the first pair of static contact ends may respectively form a first set of normally-open switches, which may be closed when the quick-action leakage detection protection circuit is in the working, reset state. The pair of dynamic contact levers and the second pair of static contact ends my respectively form a second set of normally-open switches, which may be closed when the quick-action leakage detection protection circuit is in the working, reset state. The pair of dynamic contact levers may further be provided with an elastic reset mechanism and a pair of elevating contact levers. Each elevating contact lever may contact a corresponding dynamic contact lever in a resting state and may separate from its corresponding dynamic contact lever when that dynamic contact lever acts.

A first static contact lever of a pair of static contact levers may extend from a live line end of the power input end. A second static contact lever of the pair of static contact lever may extend from a live line end of the power user end. A live line elevating contact lever of the pair of elevating contact levers and the second static contact lever may always be conductively connected. A first normally-closed switch may be formed through a live line dynamic contact lever of the pair of dynamic contact levers so that a live line end of the power load end and the live line end of the power user end are connected together when the first normally-closed switch is closed. In a reversed connection, the live line elevating contact lever and the first static contact lever may be conductively connected and the live line elevating contact lever may separate from the live line dynamic contact lever so that the live line end of the power user end and the live line end of the power input end are connected together.

The front-end normally-open switch of the analog path switch may share a third dynamic contact lever with the self-checking path switch. Further, a static end of the front-end normally-open switch may be led, through the trip coil and the rear-end normally-open switch, to a neutral line end of the power input end passing through the twin induction coils.

The return circuit of the trip coil may be further connected with a current limiting diode.

The quick-action leakage detection protection circuit may include an indicating circuit with an indicator lamp. The indicator lamp may be kept on when the quick-action leakage detection protection circuit is in a working, reset state. It may be switched off when the trip coil fails. Through the trip coil and the main circuit switch, the indicator lamp and the power input end may form a return circuit passing through the twin induction coils.

The cathode of the current limiting diode may be connected, via the rear-end normally-open switch, to a neutral line end of the power input end passing through the twin induction coils. An anode of the current limiting diode may be connected to the live line end of the power user end through the trip coil. A neutral line elevating contact lever of the pair of elevating contact levers may form, through a neutral line dynamic contact lever of the pair of dynamic contact levers, a second normally-closed switch that is disconnected in a reversed connection.

In another embodiment, the second static contact lever may be connected with a current limiting diode. An anode of the current limiting diode may be divided into two paths that are connected to the live line end of the power user end and the first end of the trip coil, respectively. A cathode of the current limiting diode may be connected to the live line end of the power load end through the live line elevating contact lever and the live line dynamic contact lever.

In yet another embodiment, the indicating circuit may further include a diode and a current limiting resistor. The diode may be a current limiting diode of the return circuit of the trip coil. An anode of the diode may be connected to a second end of the trip coil. The cathode of the diode may be connected, through the rear-end normally-open switch, to the neutral line end of the power input end passing through the twin induction coils.

In yet another embodiment, the indicating circuit may further include a current limiting resistor. A cathode of the indicator lamp may be connected to the neutral line end of the power user end through the current limiting resistor. An anode of the indicator lamp may be connected to the live line end of the power user end through the trip coil.

The first end of the trip coil may be connected to the live line end of the power input end and to the live line of the power load end via the first normally-closed switch. The second end of the trip coil may be connected to a neutral line end of the power load end via a second normally-closed switch.

Beneficial effects of the present disclosure may include the following: First, earth leakage protection, reversed wire connection protection, and timed self-checking functions may be implemented by providing the reset button, the main circuit switch, the reversed wire connection path switch, and the self-checking path switch. Second, the quick-action leakage detection protection circuit is simple in circuit structure and reliable in action. The main circuit switch abandons the seesaw structure, and thus the processing and assembling precision requirements are greatly reduced, and the reliability is greatly increased. The analog path switch and the self-checking path switch are exquisite in structure and stable and reliable in action. Assembly space is optimized. The trip coil circuit may be provided with a current limiting diode (which may indicate a diode in the circuit), thereby effectively preventing components from being damaged.

DETAILED DESCRIPTION OF THE EMBODIMENTS

Below, the present disclosure is further described with reference to specific embodiments and accompanying drawings.

Embodiment I

Figure 1:
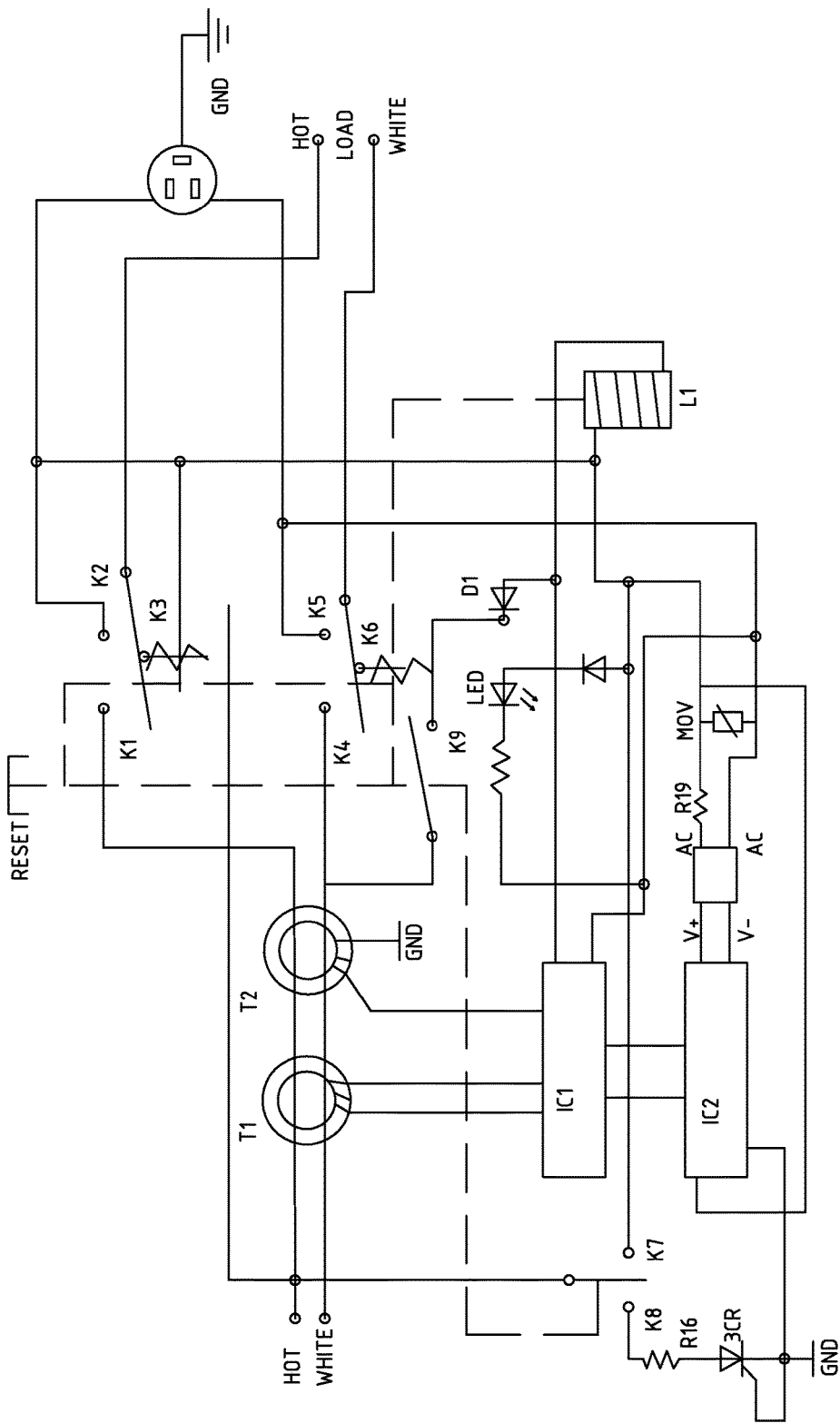
FIG. 1 is a circuit diagram according to Embodiment I of the present disclosure.

Referring to FIG. 1, a quick-action leakage detection protection circuit with a regular self-checking function according to the present disclosure may include: a power input end, a power load end, a power user end, twin induction coils (T1, T2) for detecting leakage current and low resistance failure, a control chip IC1, a trip coil L1 in which an iron core is disposed, a reset button, a self-checking chip IC2, and a self-checking silicon controlled rectifier SCR. The reset button may be linked with a main circuit switch, an analog path switch, and a normally-open self-checking path switch K8. The analog path switch comprises a front-end normally-open switch K7 and a rear-end normally-open switch K9. The front-end normally-open switch K7 is connected between a live line (e.g., hot) end of the power input end and an input end of the trip coil. The rear-end normally-open switch is connected between a neutral line (e.g., "white") end of the power input end passing through the twin induction coils and an output end of the trip coil L1. The front-end normally-open switch K7 and the rear-end normally-open switch K9 contact and close when the reset button is pressed down so that the trip coil L1 forms a return circuit passing through the twin induction coils T1, T2. An end of the self-checking path switch K8 is connected to a live line end of the power input end. The other end of the self-checking path switch K8 is grounded through the self-checking silicon controlled rectifier SCR. The self-checking path switch K8 remains closed when resetting is successfully completed.

The main circuit switch comprises a pair of dynamic contact levers extended from the power load end, a pair of static contact ends extended from the power input end passing through the twin induction coils, and a pair of static contact ends extended from the power user end. The pair of dynamic contact levers and the pair of static contact ends extended from the power input end, respectively, form normally-open switches (K1, K4), which are closed when the device is in a working, reset state. The pair of dynamic contact levers and the static contact ends extended from the power user end, respectively to form normally-open switches (K2, K5), which are closed when the device is in a working, reset state. That is, in such a state, all three sets of conductors—i.e., the power load end, the power user end, and the power input end—are conductively connected. The pair of dynamic contact levers are further provided with an elastic reset mechanism and a pair of elevating contact levers. An end of each elevating contact lever contacts the corresponding dynamic contact lever in a resting state and separates from the dynamic contact lever when the dynamic contact lever acts.

Static contact levers extend from a live line end of the power input end (e.g., at K1) and from a live line end of the power user end (e.g., at K2). A live line elevating contact lever of the pair of elevating contact levers and the static contact lever extended from the live line end of the power user end (e.g., at K2) are always conductively connected. A normally-closed switch K3 is formed through a live line dynamic contact lever of the pair of dynamic contact levers. When K3 is closed, the live line end of the power load end and the live line end of the power user end are connected together.

In a reversed connection, the live line elevating contact lever and the static contact lever extended from the live line end of the power input end are conductively connected and the live line elevating contact lever separates from the live line dynamic contact lever so that the live line end of the power user end and the live line end of the power input end are connected together.

The front-end normally-open switch K7 of the analog path switch shares a third dynamic contact lever with the self-checking path switch K8. The static contact end of the front-end normally-open switch K7 is led, through the trip coil L1 and the rear-end normally-open switch K9, to a neutral line of the power input end passing through the twin induction coils (T1, T2).

In this embodiment, to prevent the trip coil from being damaged due to temperature rise in a repeated testing process, a return circuit of the trip coil L1 is further connected with a current limiting diode D1.

To facilitate users' monitoring of circuit function, the quick-action leakage detection protection circuit with a regular self-checking function further includes an indicating circuit comprising an indicator lamp LED which is kept on when in a working, reset state and is switched off when the trip coil L1 fails to function properly. Through the trip coil L1 and the main circuit switch, the indicator lamp LED and the power input end form a return circuit passing through the twin induction coils (T1, T2).

In this embodiment, a cathode of the current limiting diode D1 is connected, via the rear-end normally-open switch K9 of the analog path switch, to a neutral line of the power input end passing through the twin induction coils (T1, T2). An anode of the current limiting diode D1 is connected to the live line end of the power user end through the trip coil L1. A neutral line elevating contact lever of the pair of elevating contact levers forms, through a neutral line dynamic contact lever of the main circuit switch, a normally-closed switch K6 that is disconnected in a reversed connection.

Embodiment II

Figure 2:
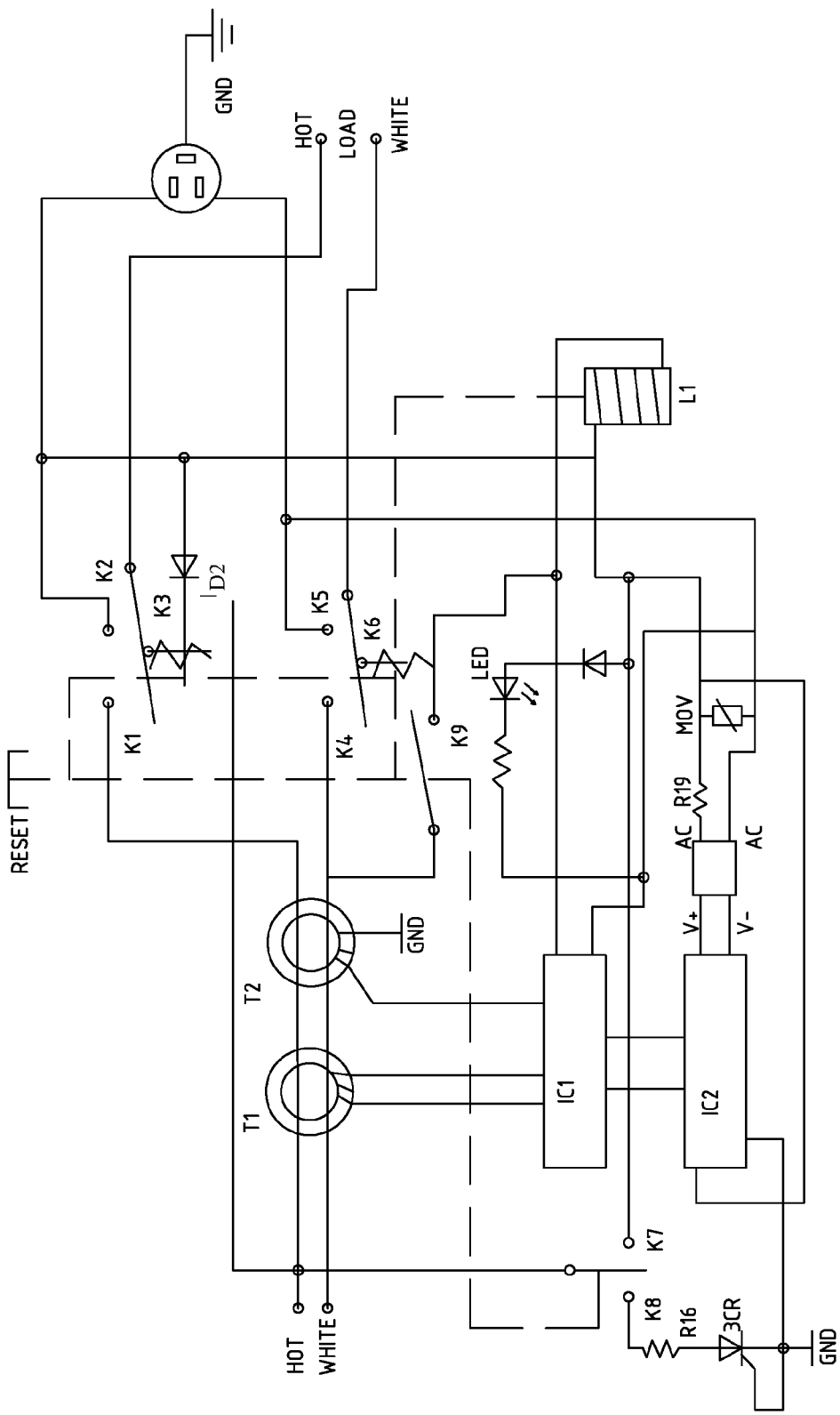
FIG. 2 is a circuit diagram according to Embodiment II of the present disclosure.

Referring to FIG. 2, in this embodiment, the static contact lever extended from the live line end of the power user end is connected with a current limiting diode D2. An anode of the current limiting diode D2 is divided into two paths that are connected to the live line end of the power user end and an input end of the trip coil L1, respectively. A cathode of the current limiting diode D2 is connected to the live line end of the power load end through the live line elevating contact lever of the pair of elevating contact levers and the live line dynamic contact lever of the main circuit switch. Additionally, in this embodiment, current limiting diode D1 may be omitted.

Embodiment III

Figure 3:
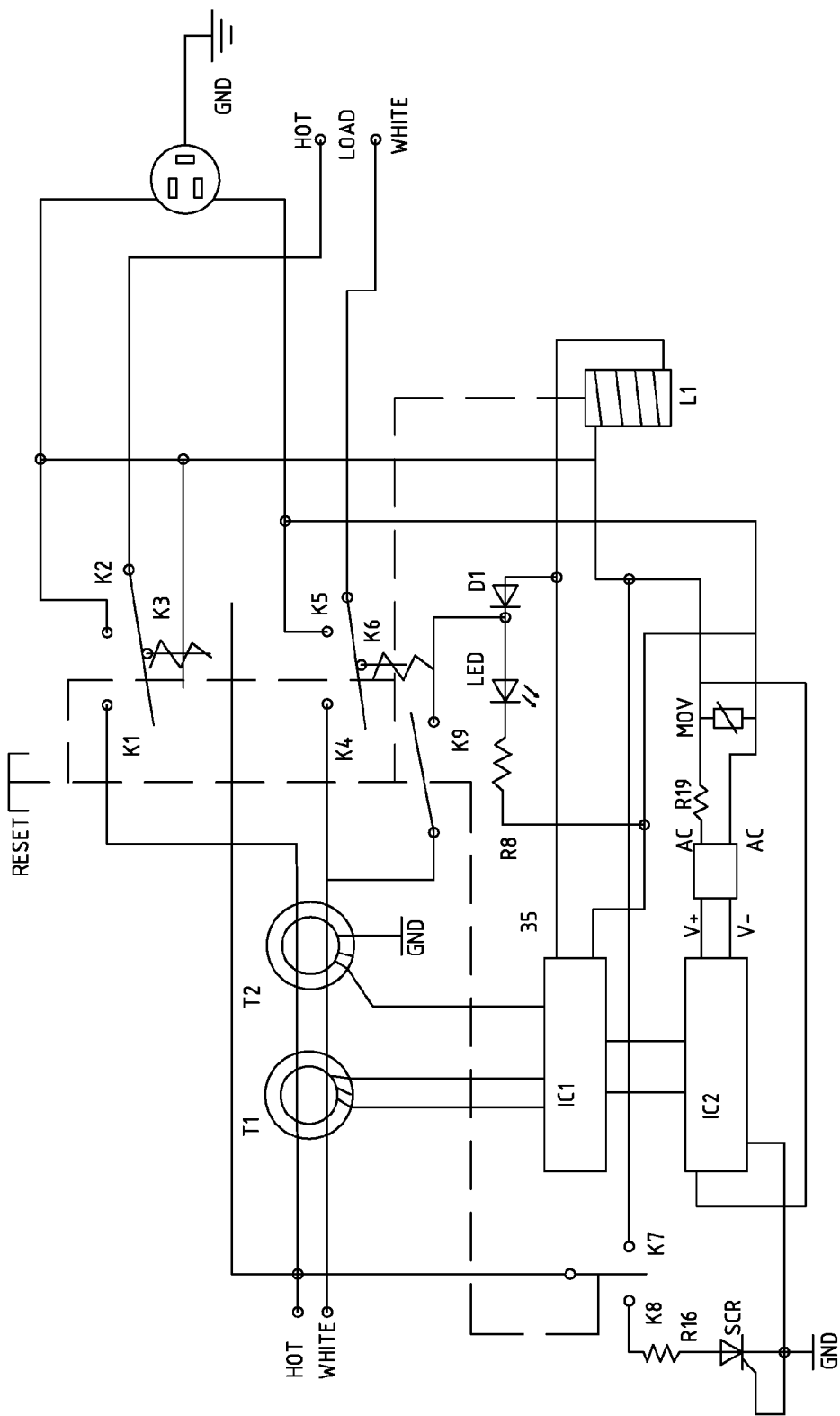
FIG. 3 is a circuit diagram according to Embodiment III of the present disclosure.

Referring to FIG. 3, in this embodiment, as with embodiment I, the indicating circuit also includes diode D1, which serves as a current limiting diode of the return circuit of the trip coil. This embodiment also includes a current limiting resistor R8. An anode of the diode D1 is connected to an output end of the trip coil L1. A cathode of the diode D1 also is connected, through the rear-end normally-open switch K9 of the analog path switch, to the neutral line of the power input end passing through the twin induction coils (T1, T2).

Embodiment IV

Figure 4:
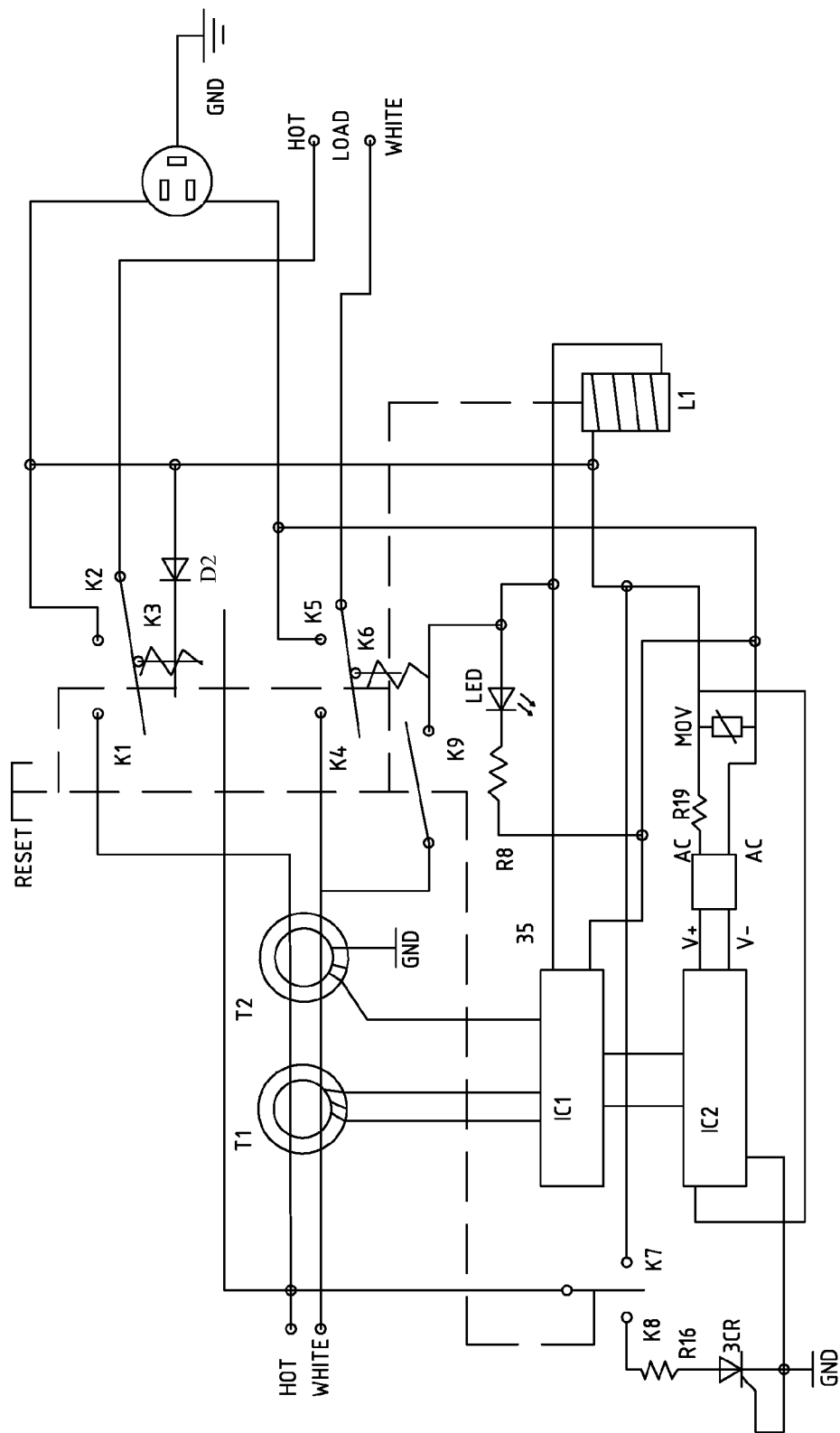
FIG. 4 is a circuit diagram according to Embodiment IV of the present disclosure.

Referring to FIG. 4, in this embodiment, as with embodiment III, the indicating circuit includes a current limiting resistor R8. Further, as with embodiment II, this embodiment includes a current limiting diode D2. A cathode of the indicator lamp LED is connected to the zero line end of the power user end through the current limiting resistor R8, and an anode of the indicator lamp LED is connected to the live line end of the power user end through the trip coil L1.

Although the present disclosure has been illustrated and described with reference to preferred embodiments, those of ordinary skill in the art should understand that the present disclosure may be not limited to the description of the above embodiments, and may make various variations in form and in detail within the scope of the claims.

What is claimed is:

1. A quick-action leakage detection protection circuit with a regular self-checking function, comprising:
    a power input end;
    a power load end;
    a power user end;
    twin induction coils for detecting leakage current and low resistance failure,
    a control chip;
    a trip coil in which an iron core is disposed;
    a reset button;
    a self-checking chip; and
    a self-checking silicon controlled rectifier,
    wherein:
        the reset button is linked with a main circuit switch, an analog path switch, and a normally-open self-checking path switch;
        the analog path switch comprises a front-end normally-open switch and a rear-end normally-open switch;
        the front-end normally-open switch is connected between a live line end of the power input end and a first end of the trip coil;
        the rear-end normally-open switch is connected between a neutral line end of the power input end passing through the twin induction coils and a second end of the trip coil;
        the front-end normally-open switch and the rear-end normally-open switch contact and close when the reset button is pressed down so that the trip coil forms a return circuit passing through the twin induction coils,
        a first end of the self-checking path switch is connected to a live line end of the power input end;
        a second end of the self-checking path switch is grounded through the self-checking silicon controlled rectifier;
        the self-checking path switch is closed when the quick-action leakage detection protection circuit is in a working, reset state;
        the main circuit switch comprises a pair of dynamic contact levers extended from the power load end, a first pair of static contact ends extended from the power input end passing through the twin induction coils, and a second pair of static contact ends extended from the power user end;
        the pair of dynamic contact levers and the first pair of static contact ends respectively form a first set of normally-open switches which are closed when the quick-action leakage detection protection circuit is in the working, reset state;
        the pair of dynamic contact levers and the second pair of static contact ends respectively form a second set of normally-open switches which are closed when the quick-action leakage detection protection circuit is in the working, reset state;
        the pair of dynamic contact levers are further provided with an elastic reset mechanism and a pair of elevating contact levers;
        each elevating contact lever contacts a corresponding dynamic contact lever in a resting state and separates from its corresponding dynamic contact lever when the corresponding dynamic contact lever acts;
        a first static contact lever of a pair of static contact levers extends from a live line end of the power input end;
        a second static contact lever of the pair of static contact lever extends from a live line end of the power user end;
        a live line elevating contact lever of the pair of elevating contact levers and the second static contact lever are always conductively connected,
        a first normally-closed switch is formed through a live line dynamic contact lever of the pair of dynamic contact levers so that a live line end of the power load end and the live line end of the power user end are connected together when the first normally-closed switch is closed; and
        in a reversed connection, the live line elevating contact lever and the first static contact lever are conductively connected and the live line elevating contact lever separates from the live line dynamic contact lever so that the live line end of the power user end and the live line end of the power input end are connected together.

2. The quick-action leakage detection protection circuit of claim 1, wherein:
    the front-end normally-open switch of the analog path switch shares a third dynamic contact lever with the self-checking path switch; and
    a static end of the front-end normally-open switch is led, through the trip coil and the rear-end normally-open switch, to a neutral line end of the power input end passing through the twin induction coils.

3. The quick-action leakage detection protection circuit of claim 1, wherein the return circuit of the trip coil is further connected with a current limiting diode.

4. The quick-action leakage detection protection circuit of claim 1, further comprising:
    an indicating circuit including an indicator lamp,
    wherein:
        the indicator lamp is kept on when the quick-action leakage detection protection circuit is in a working, reset state;
        the indicator lamp is switched off when the trip coil fails; and
        through the trip coil and the main circuit switch, the indicator lamp and the power input end form a return circuit passing through the twin induction coils.

5. The quick-action leakage detection protection circuit of claim 3, wherein:
    a cathode of the current limiting diode is connected, via the rear-end normally-open switch, to a neutral line end of the power input end passing through the twin induction coils;
    an anode of the current limiting diode is connected to the live line end of the power user end through the trip coil; and
    a neutral line elevating contact lever of the pair of elevating contact levers forms, through a neutral line dynamic contact lever of the pair of dynamic contact levers, a second normally-closed switch that is disconnected in a reversed connection.

6. The quick-action leakage detection protection circuit of claim 1, wherein:
    the second static contact lever is connected with a current limiting diode;

an anode of the current limiting diode is divided into two paths that are connected to the live line end of the power user end and the first end of the trip coil, respectively; and a cathode of the current limiting diode is connected to the live line end of the power load end through the live line elevating contact lever and the live line dynamic contact lever.

7. The quick-action leakage detection protection circuit of claim 4, wherein:

the indicating circuit further comprises a diode and a current limiting resistor;

the diode is a current limiting diode of the return circuit of the trip coil;

an anode of the diode is connected to the second end of the trip coil; and a cathode of the diode is connected, through the rear-end normally-open switch, to the neutral line end of the power input end passing through the twin induction coils.

8. The quick-action leakage detection protection circuit of claim 4, wherein:

the indicating circuit further comprises a current limiting resistor, a cathode of the indicator lamp is connected to the neutral line end of the power user end through the current limiting resistor; and an anode of the indicator lamp is connected to the live line end of the power user end through the trip coil.

9. The quick-action leakage detection protection circuit of claim 1, wherein:

the first end of the trip coil is connected to the live line end of the power input end and to the live line of the power load end via the first normally-closed switch; and the second end of the trip coil is connected to a neutral line end of the power load end via a second normally-closed switch.

* * * * *